United States Patent
Seo

(10) Patent No.: US 7,602,144 B2
(45) Date of Patent: Oct. 13, 2009

(54) BATTERY MANAGEMENT SYSTEM

(75) Inventor: Se-Wook Seo, Suwon-si (KR)

(73) Assignee: Samsung SDI Co., Ltd., Yeongtong-gu, Suwon-si, Gyeonggi-do (KR)

( * ) Notice: Subject to any disclaimer, the term of this patent is extended or adjusted under 35 U.S.C. 154(b) by 175 days.

(21) Appl. No.: 11/583,113

(22) Filed: Oct. 19, 2006

(65) Prior Publication Data

US 2007/0090802 A1    Apr. 26, 2007

(30) Foreign Application Priority Data

Oct. 20, 2005    (KR) ...................... 10-2005-0099086

(51) Int. Cl.
*H02J 7/00* (2006.01)

(52) U.S. Cl. ...................... 320/116; 324/434

(58) Field of Classification Search ......... 320/116–118; 324/434

See application file for complete search history.

(56) References Cited

U.S. PATENT DOCUMENTS

| | | | | |
|---|---|---|---|---|
| 5,796,334 | A * | 8/1998 | Chen et al. | 340/539.3 |
| 6,255,826 | B1 * | 7/2001 | Ohsawa et al. | 324/426 |
| 6,472,880 | B1 | 10/2002 | Kang | |
| 6,639,409 | B2 * | 10/2003 | Morimoto et al. | 324/434 |
| 6,803,766 | B2 * | 10/2004 | Kobayashi et al. | 324/434 |
| 7,126,342 | B2 * | 10/2006 | Iwabuchi et al. | 324/426 |
| 2006/0028179 | A1 * | 2/2006 | Yudahira et al. | 320/133 |

FOREIGN PATENT DOCUMENTS

| | | |
|---|---|---|
| JP | 6231806 | 8/1994 |
| JP | 11-160367 | 6/1999 |
| JP | 2003-134675 | 5/2003 |
| KR | 10-2005-0089816 | 9/2005 |

OTHER PUBLICATIONS

U.S. Appl. No. 11/583,118, filed Oct. 19, 2006, Han-Seok Yun et al.

* cited by examiner

*Primary Examiner*—Akm E Ullah
*Assistant Examiner*—Samuel Berhanu
(74) *Attorney, Agent, or Firm*—Robert E. Bushnell, Esq.

(57) ABSTRACT

The present invention relates to a battery management system for securely maintaining battery charging capacity and precisely measuring a battery pack voltage. The battery management system, which is coupled to a battery including a plurality of battery cells as one battery pack, includes a sensing stabilization unit, a relay, a battery pack voltage measurement signal generating unit, and an analog/digital (A/D) converter. The sensing stabilization unit includes a first and a second signal lines electrically coupled to a first and a second terminals of the battery, respectively, and maintains a stable potential difference between the first and second signal lines. The relay is turned on in response to a control signal, and transmits the potential difference between the first and second signal lines. The battery pack voltage measurement signal generating unit outputs a predetermined level of battery pack voltage measurement signal that is produced based on the potential difference between the first and second signal lines. The A/D converter receives the battery pack voltage measurement signal and converts it into a digital signal.

10 Claims, 5 Drawing Sheets

BATTERY MANAGEMENT SYSTEM

CLAIM OF PRIORITY

This application makes reference to, incorporates the same herein, and claims all benefits accruing under 35 U.S.C.§ 119 from an application earlier filed in the Korean Intellectual Property Office on 20 Oct. 2005 and there duly assigned Serial No. 10-2005-0099086.

BACKGROUND OF THE INVENTION

1. Field of the Invention

The present invention relates to a battery management system. More particularly, the present invention relates to a battery management system that can be used in a vehicle that is driven by electrical energy.

2. Description of the Related Art

Vehicles using an internal combustion engine of gasoline or heavy oil have caused serious air pollution. Accordingly, various efforts for developing electric or hybrid vehicles have recently been made to reduce air pollution.

An electric vehicle uses an electric motor that is operated by electrical energy outputted from a battery. Since the electric vehicle mainly uses a battery formed by one battery pack including a plurality of rechargeable/dischargeable secondary cells, the vehicle has advantages that it has no emission gas and less noise than the vehicle that uses combustion engine.

In the other hand, a hybrid vehicle commonly refers to a gasoline-electric hybrid vehicle that uses an internal-combustion engine and an electric motor to drive the vehicle. Recently, hybrid vehicles using an internal-combustion engine and fuel cells and hybrid vehicles using a battery and fuel cells have been developed. The fuel cells directly obtain electrical energy by generating a chemical reaction of hydrogen and oxygen that are continuously provided to the fuel cells.

In these electric vehicle and hybrid vehicle, performance of a battery directly affects the performance of the vehicle that uses electrical energy, and therefore each cell of the battery is required to have great performance. Also, a battery management system is required to measure a voltage and a current of the battery, and to efficiently manage charging/discharging operations of each battery cell.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a battery management system for securely maintaining battery charging capacity. In addition, the present invention provides a battery management system for precisely measuring a battery pack voltage.

An exemplary battery management system constructed as an embodiment of the present invention is coupled to a battery including a plurality of battery cells as one battery pack. An exemplary battery management system includes a sensing stabilization unit, a battery pack voltage measurement signal generating unit, and an analog/digital (A/D) converter. The sensing stabilization unit includes a first signal line and a second signal line electrically coupled to a first terminal and a second terminal of the battery, respectively, and maintains a stable potential difference between the first signal line and the second signal line. The battery pack voltage measurement signal generating unit outputs a predetermined level of battery pack voltage measurement signal that is produced based on the potential difference between the first signal line and the second signal line. The A/D converter receives the battery pack voltage measurement signal and converts it into a digital signal.

The battery management system may further include a current controlling unit coupled to the first signal line and the second signal line of the sensing stabilization unit. The current controlling unit controls amounts of the currents respectively applied to the first signal line and the second signal line from the first terminal and the second terminal of the battery. The current controlling unit may include a first resistor coupled to the first signal line in series and a second resistor coupled to the second signal line in series.

The battery management system may further include a noise eliminating unit for eliminating a noise in the battery pack voltage measurement signal outputted from the battery pack voltage measurement signal generating unit.

An exemplary battery management system constructed as another embodiment of the present invention includes a control signal generator, a cell voltage measuring unit, a battery pack voltage measuring unit, a battery pack current measuring unit, and an analog/digital (A/D) converter. The cell voltage measuring unit measures cell voltages of the plurality of battery cells, and outputs a plurality of cell voltage measurement signals. The battery pack voltage measuring unit can be turned on when The battery pack voltage measuring unit receives an on-level of the control signal from the control signal generator. The battery pack voltage measuring unit measures a battery pack voltage of the battery pack, and outputs a battery pack voltage measurement signal. The battery pack current measuring unit measures a battery pack current of the battery pack, and outputs a battery pack current measurement signal. The A/D converter receives the cell voltage measurement signals, the battery pack voltage measurement signal, and the battery pack current measurement signal, and converts the signals to digital signals.

The battery pack voltage measuring unit may include a relay and a battery pack voltage measurement signal generating unit. The relay is turned on when the relay receives the on-level control signal, and transmits a potential difference between a first output terminal and a second output terminal of the battery. The battery pack voltage measurement signal generating unit generates a battery pack voltage measurement signal based on the potential difference transmitted by the relay.

The battery pack voltage measuring unit may include a first resistor coupled to the first output terminal of the battery and coupled to a first input terminal of the relay, and a second resistor coupled to the second output terminal of the battery and coupled to a second input terminal of the relay. The battery pack voltage measurement signal generating unit may include an inverting differential amplifier for generating the battery pack voltage measurement signal.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Figure 1:
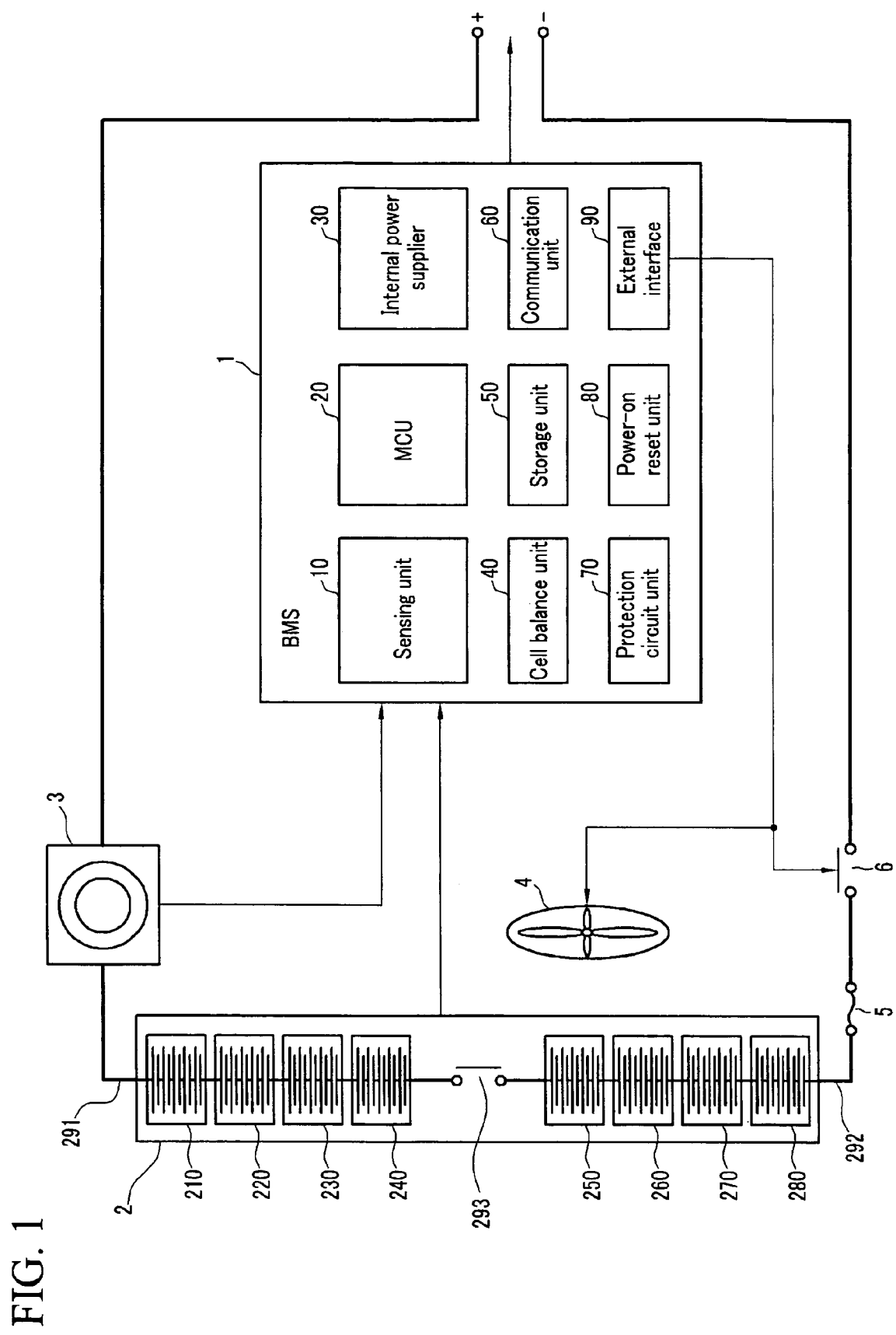
FIG. 1 shows a diagram representing a battery, a battery management system (BMS), and peripheral devices of the BMS that can be used in a vehicle.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims which follow, when it is described that an element is coupled to another element, the element may be directly coupled to the other element or electrically coupled to the other element through a third element. In addition, throughout this specification and the claims which follow, unless explicitly described to the contrary, the word "comprise/include" or variations such as "comprises/includes" or "comprising/including" will be understood to imply the inclusion of stated elements but not the exclusion of any other elements.

FIG. 1 shows a diagram representing a battery, a battery management system (BMS), and peripheral devices of the BMS that can be used in a vehicle. BMS 1, battery 2, current sensor 3, cooling fan 4, fuse 5, and main switch 6 are shown in FIG. 1. Current sensor 3 measures an amount of an output current of battery 2, and outputs the measured amount of output current to BMS 1. Cooling fan 4, in response to a control signal from BMS 1, reduces heat generated during charging/discharging process of battery 2, and prevents deterioration and reduction of charge/discharge efficiency of battery 2, which can be caused by a temperature increase of battery 2. Fuse 5 prevents an over-current, which may be caused by a disconnection or a short circuit of battery 2, from being transmitted to a power generator (not shown) of a vehicle. That is, when there is current overload, fuse 5 is disconnected so as to block the over-current. Main switch 6 turns on or off battery 2 in response to a control signal sent from BMS 1 or a control signal sent from an engine control unit (ECU, not shown) when unusual phenomenon, such as an over-voltage, an over-current, and a high temperature, occurs.

Battery 2 includes eight sub-packs 210 to 280 coupled in series to each other, positive output terminal 291, negative output terminal 292, and safety switch 293 provided between sub-pack 240 and sub-pack 250. Sub-pack 210 includes five secondary battery cells coupled in series. Sub-packs 220 to 280 respectively include five secondary battery cells, and therefore battery 2 includes forty secondary battery cells.

Even though it is described, for better understanding in a first exemplary embodiment of the present invention, that each sub-pack is formed by grouping five secondary battery cells as one group, battery 2 may include the forty secondary battery cells directly coupled to each other without being grouped into sub-packs 210 to 280.

Output terminals 291 and 292 are coupled to a power generator (not shown) of a vehicle to supply electrical energy to a vehicle engine. The power generator of the exemplary embodiment of the present invention is can be an alternator. The alternator may be able to simultaneously function as a motor and a generator. The vehicle engine of the exemplary embodiment of the present invention can be any type of engine capable of driving a vehicle such as a combustion engine, an electric motor, or combinations thereof. Safety switch 293 is provided between sub-pack 240 and sub-pack 250 to manually turn on or off battery 2 for the safety of an operator when the operator handles or replaces battery 2. In this exemplary embodiment of the present invention, safety switch 293 is located between sub-pack 240 and sub-pack 250, but the location of safety switch 293 is not limited to this position, and can be changed depending on the design of the system.

BMS 1 includes sensing unit 10, main control unit (MCU) 20, internal power supplier 30, cell balance unit 40, storage unit 50, communication unit 60, protection circuit unit 70, power-on reset unit 80, and external interface 90.

Sensing unit 10 measures an entire battery pack current, an entire battery pack voltage, voltage of each battery cell, temperature of each battery cell, and peripheral temperature. Sensing unit 10 converts the measured values into digital data, and transmits the digital data to MCU 20. MCU 20 determines a state of charge (SOC) and a state of health (SOH) of battery 2 based on the digital data transmitted from sensing unit 10, and controls charging/discharging operation of battery 2.

Internal power supplier 30 supplies power to BMS 1 by using a backup battery. Cell balance unit 40 balances the state of charge of each cell. That is, cells sufficiently charged are discharged, and cells relatively less charged are further charged. Storage unit 50 stores data of the current SOC and SOH when the power source of BMS 1 is turned off. An electrically erasable programmable read-only memory (EEPROM) may be used for storage unit 50. Communication unit 60 communicates with a controller (not shown) of the power generator of the vehicle. Protection circuit unit 70 uses a firmware to protect battery 2 from shocks, over-currents, or low voltage. Power-on reset unit 80 resets the entire system when the power source of BMS 1 is turned on. External interface 90 makes auxiliary devices of BMS 1, such as cooling fan 4 and main switch 6, be coupled to MCU 20. In this exemplary embodiment of the present invention, cooling fan 4 and main switch 6 are described as auxiliary devices of BMS 1, but the auxiliary devices can include other types of devices, and any number of auxiliary devices can be included.

Figure 2:
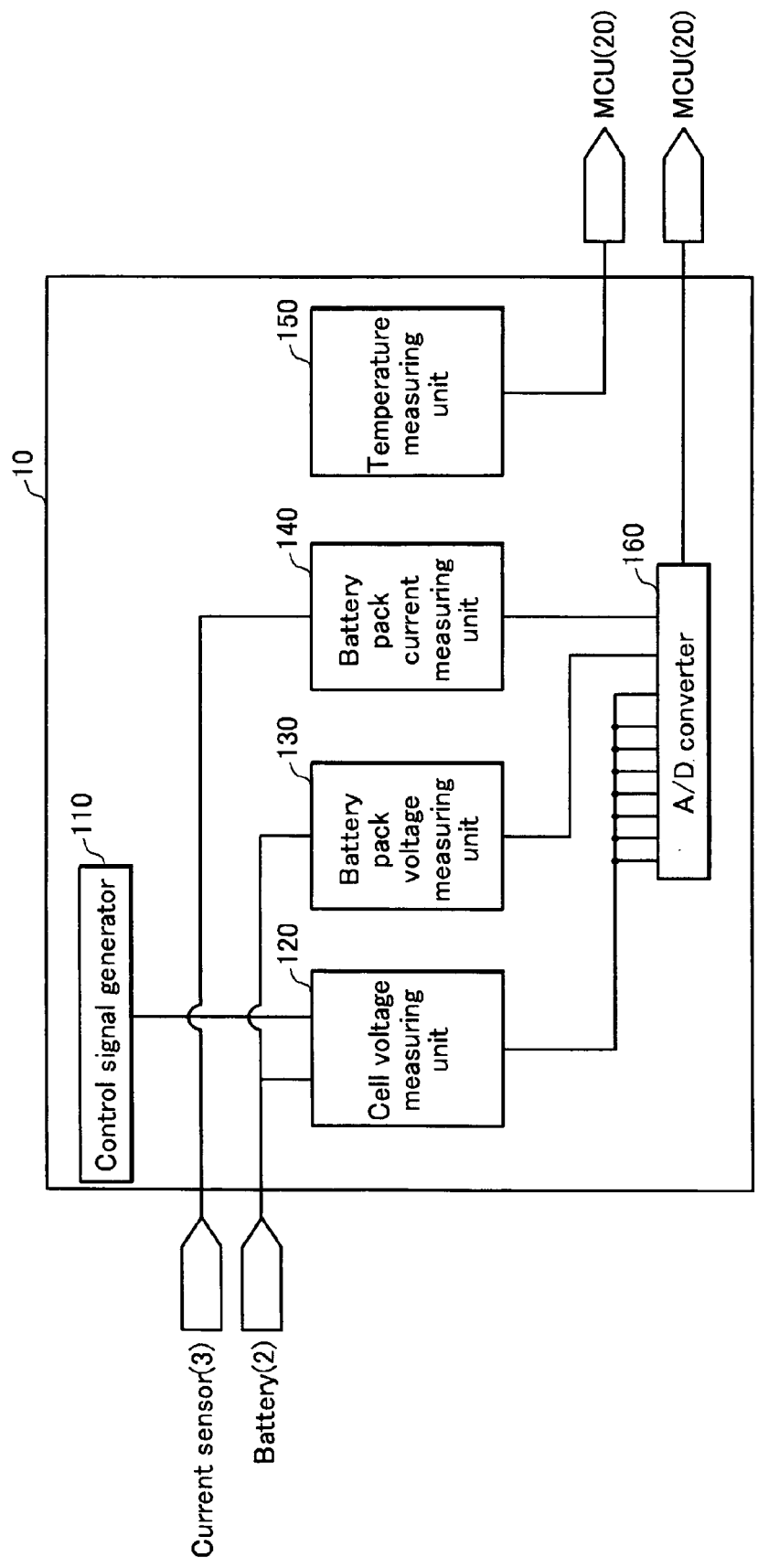
FIG. 2 shows a diagram of a configuration of a sensing unit constructed as a first exemplary embodiment of the present invention.

FIG. 2 shows a diagram of a configuration of sensing unit 10 built as a first exemplary embodiment of the present invention. As shown in FIG. 2, sensing unit 10 includes control signal generator 110, cell voltage measuring unit 120, battery pack voltage measuring unit 130, battery pack current measuring unit 140, temperature measuring unit 150, and analogue/digital (A/D) converter 160.

Control signal generator 110 generates a control signal and outputs the control signal to cell voltage measuring unit 120 in order to make cell voltage measuring unit 120 sequentially measure voltages of the forty battery cells. Cell voltage measuring unit 120 measures analogue cell voltages of the forty battery cells of battery 2, and outputs the measured voltages to A/D converter 160. Battery pack voltage measuring unit 130 measures an analog voltage between output terminals 291 and 292, shown in FIG. 1, of battery 2, and outputs the voltage to A/D converter 160. Battery pack current measuring unit 140 receives the current value measured by current sensor 3, shown in FIG. 1, and converts the current value into an analog voltage signal. Battery pack current measuring unit 140 outputs the converted voltage signal to A/D converter 160.

A/D converter 160 converts the analog values received from cell voltage measuring unit 120, battery pack voltage measuring unit 130, and battery pack current measuring unit 140 into digital data, and outputs the data to MCU 20 shown in FIG. 1. In further detail, A/D converter 160 includes ten input terminals, and sequentially converts the analog data received through the input terminals into digital data. Eight input terminals (referred to as the first to eighth input terminals) among the ten input terminals are coupled to an output terminal of cell voltage measuring unit 120, another input terminal (referred to as the ninth input terminal) is coupled to battery pack voltage measuring unit 130, and the other input terminal (referred to as the tenth input terminal) is coupled to battery pack current measuring unit 140.

Temperature measuring unit 150 measures temperature inside battery 2 and peripheral temperature of battery 2, and outputs the measured values to MCU 20 as digital signals.

Figure 3:
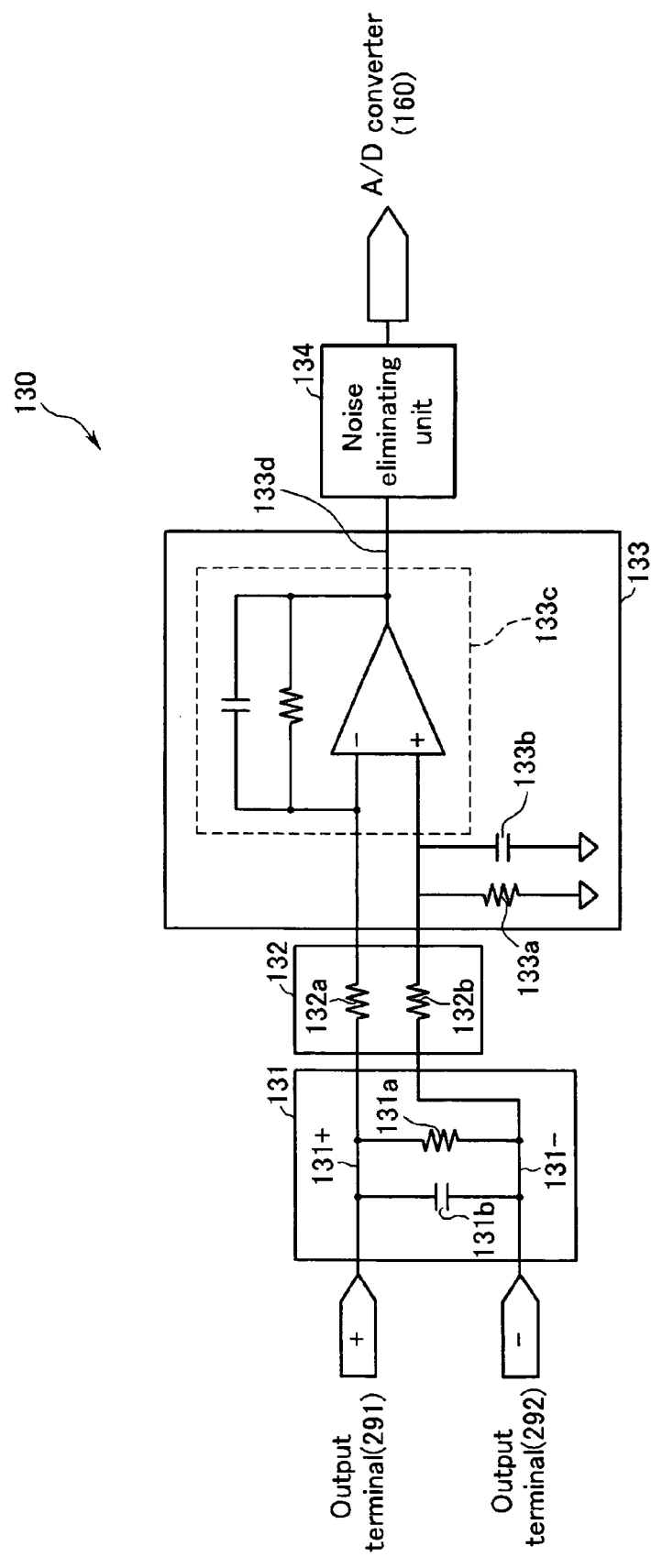
FIG. 3 shows a diagram of a configuration of a battery pack voltage measuring unit of the first exemplary embodiment of the present invention.

FIG. 3 shows a diagram of a configuration of battery pack voltage measuring unit 130 constructed as the first exemplary embodiment of the present invention. As shown in FIG. 3, battery pack voltage measuring unit 130 includes sensing stabilization unit 131, current controlling unit 132, attenuation unit 133, and noise eliminating unit 134.

Sensing stabilization unit 131 includes resistor 131*a* and capacitor 131*b*. Resistor 131*a* and capacitor 131*b* are coupled in parallel between signal line 131+ coupled to positive output terminal 291 of battery 2 and signal line 132− coupled to negative output terminal 292 of battery 2. Resistor 131*a* and capacitor 131*b* cooperate to maintain a stable potential difference between the signal line 131+ and the signal line 131−. For example, if potential difference between signal line 131+ and signal line 131− fluctuates due to a noise inputted to signal line 131+ or signal line 131−, resistor 131*a* and capacitor 131*b* may filter the noise and have the potential difference between signal line 131+ and the signal line 131− maintained without noise. In this case, the capacitor 131*b* also maintains a voltage difference between both terminals thereof. In other words, a voltage at the output terminal 291 and a voltage at the output terminal 292 are respectively applied to each of the terminals of the capacitor 131*b*. In this case, when noises occur in the voltages of the output terminals 291 and 292, the noises are also transmitted to the terminals of the capacitor 131*b*, and voltages at the terminals of the capacitor 131*b* are affected by the noises. However, since the noises at both of the terminals of the capacitor 131*b* are offset to each other, the voltage difference between both the terminals of the capacitor 131*b* may be maintained without noise. In addition, the resistor 131*a* prevents inrush currents, and the sensing stabilization unit 131 may not include the resistor 131*a*.

Current controlling unit 132 controls the amounts of the currents applied to signal line 131+ and signal line 131− from positive output terminal 291 and negative output terminal 292 of battery 2, respectively. Current controlling unit 132 includes resistor 132*a* coupled to signal line 131+ in series, and resistor 132*b* coupled to signal line 131− in series. Amounts of currents flowing through current controlling unit 132 change due to resistors 132*a* and 132*b*. For example, when the battery pack voltage of battery 2 is 200 V, the current is 0.1 mA when resistance of each of resistors 132*a* and 132*b* is 2 mega-ohm (MΩ). In this exemplary embodiment of the present invention, each of resistors 132*a* and 132*b* includes only one resistor of 2 mega-ohm, but can include two resistors coupled in series, each of which has resistance of 1 mega-ohm.

Attenuation unit 133 is a battery pack voltage measurement signal generating unit for generating a signal corresponding to the battery pack voltage of battery 2. Attenuation unit 133 includes resistor 133*a* coupled to a ground electrode, capacitor 133*b* coupled to a ground electrode, differential amplifier 133*c*, and output terminal 133*d*. In differential amplifier 133*c*, which is an inverting differential amplifier, a ground potential is inputted to a positive (+) input terminal through resistor 133*a* and capacitor 133*b*, and a potential at positive output terminal 291 of battery 2 is inputted to a negative (−) input terminal through resistor 132*a* of current controlling unit 132. A battery pack voltage measurement signal is outputted to output terminal 133*d* based on a potential difference between the ground potential and the potential at positive output terminal 291. In the attenuation unit 133, the magnitude of the battery pack voltage of battery 2, which is inputted through signal line 131+, is converted to the battery pack voltage measurement signal that has a scale between 0 V and 5 V.

Noise eliminating unit 134 eliminates the noise from a signal outputted from output terminal 133*d* of attenuation unit 133. A low pass filter may be used for noise eliminating unit 134. An analog battery pack voltage measurement signal outputted from noise eliminating unit 134 is inputted to ninth input terminal of A/D converter 160, and is converted into a digital signal.

Figure 4:
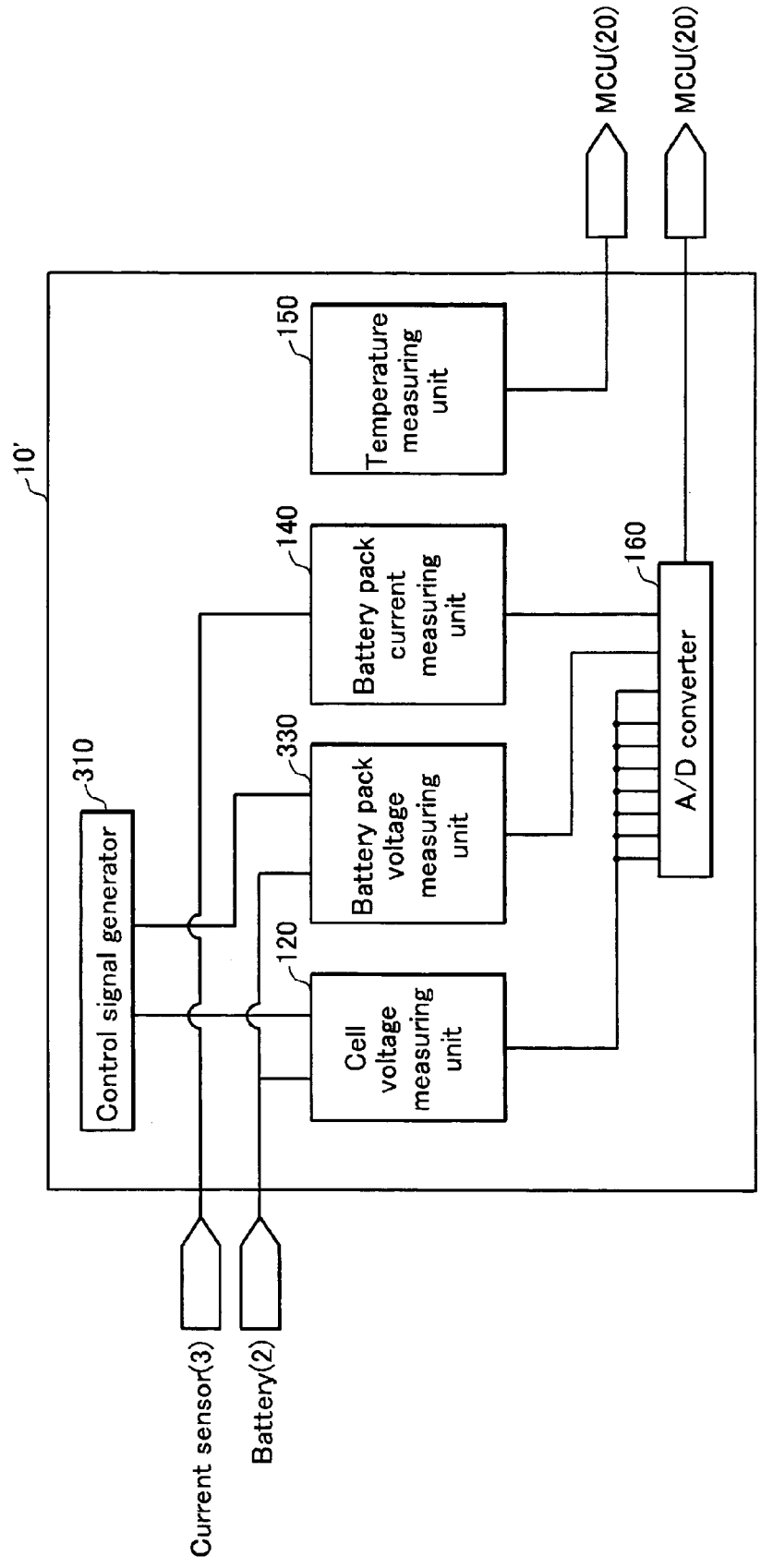
FIG. 4 shows a diagram of a configuration of a sensing unit constructed as a second exemplary embodiment of the present invention.

A second exemplary embodiment of the present invention will now be described with reference to FIG. 4 and FIG. 5. FIG. 4 shows a diagram of a configuration of sensing unit 10' constructed as the second exemplary embodiment of the present invention, and FIG. 5 shows a diagram of a configuration of battery pack voltage measuring unit 330 constructed according to the principles of the second exemplary embodiment of the present invention.

Differences from the first exemplary embodiment of the present invention is that battery pack voltage measuring unit 330 of the second exemplary embodiment of the present invention operates in response to a control signal transmitted from control signal generator 310. Because of such difference, the battery pack voltage can be more accurately measured, and a leak current can be effectively blocked when the power source of BMS 1 is in off-state.

Since operations of cell voltage measuring unit 120, battery pack current measuring unit 140, temperature measuring unit 150, and A/D converter 160 are the same as those of the first exemplary embodiment of the present invention, detailed descriptions thereof will be skipped, and reference numbers thereof will be the same.

Figure 5:
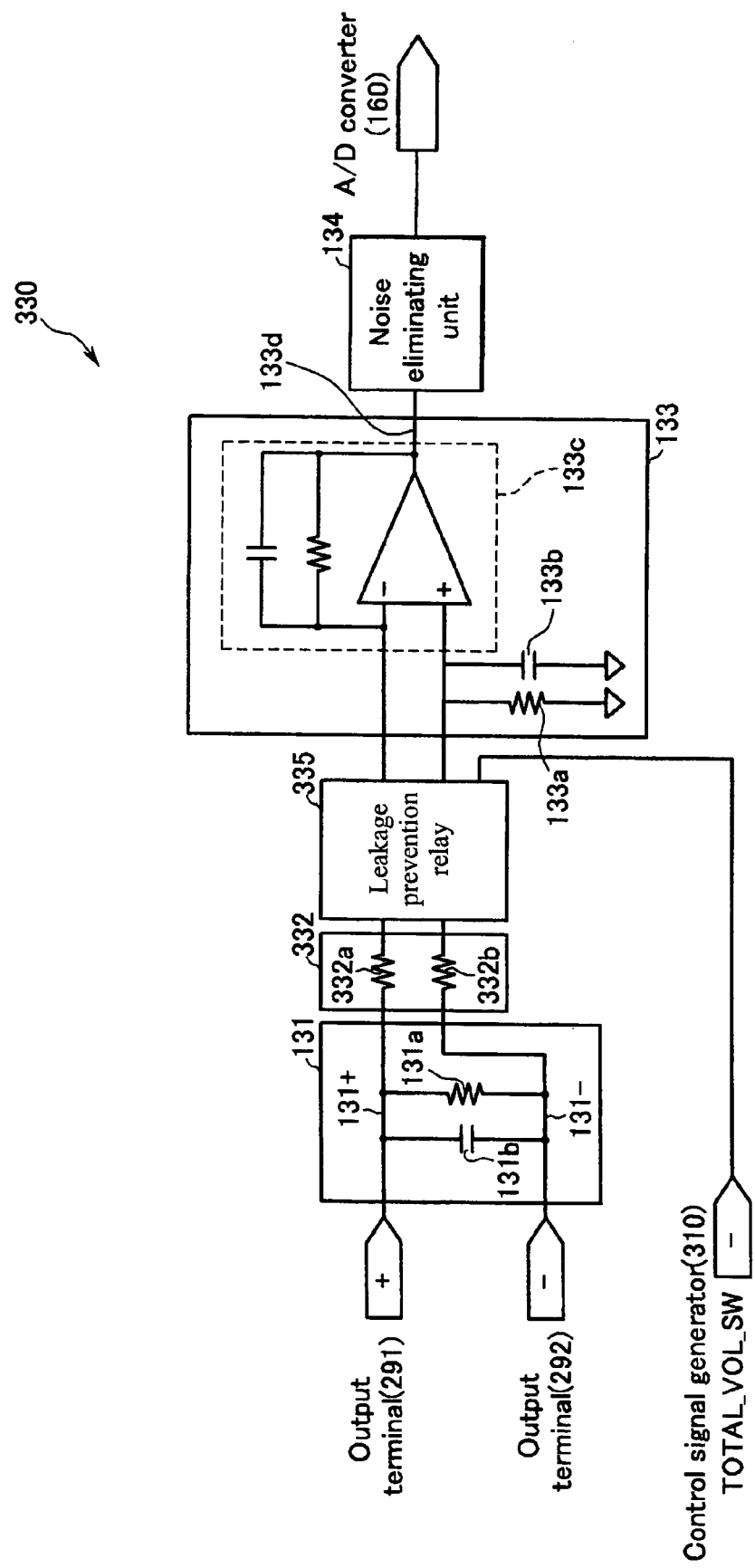
FIG. 5 shows a diagram of a configuration of a battery pack voltage measuring unit of the second exemplary embodiment of the present invention.

As shown in FIG. 4 and FIG. 5, control signal generator 310 generates a control signal, TOTAL_VOL_SW, and outputs the control signal, TOTAL_VOL_SW, to battery pack voltage measuring unit 330. Even though it is described that the control signal, TOTAL_VOL_SW, is generated in control signal generator 310 in this exemplary embodiment of the present invention, the control signal, TOTAL_VOL_SW, can be directly generated in MCU 20 shown in FIG. 1 and be transmitted to battery pack voltage measuring unit 330.

Battery pack voltage measuring unit 330 measures the battery pack voltage of output terminals 291 and 292 of battery 2, based on the control signal, TOTAL_VOL_SW. In further detail, referring to FIG. 5, battery pack voltage measuring unit 330 includes sensing stabilization unit 131, attenuation unit 133, and noise eliminating unit 134, as included in battery pack voltage measuring unit 130 of the first exemplary embodiment. Battery pack voltage measuring unit 330 further includes current controlling unit 332 and a leakage prevention relay 335.

Current controlling unit 332 includes resistor 332a coupled to signal line 131+ in series and resistor 332b coupled to signal line 131− in series. Resistances of resistor 332a and resistor 332b may be smaller than the resistance of resistor 132a and the resistor 132b shown in FIG. 3 of the first exemplary embodiment of the present invention. For example, when the battery pack voltage of the battery 2 is 200 V, the current may be set to 1 mA by using resistors 332a and 332b of 200 kilo-ohm (kΩ). While it has been described that each of resistor 332a and resistor 332b uses one 200 kilo-ohm (kΩ) resistor in the exemplary embodiment of the present invention, they can be replaced with two resistors of 100 kilo-ohm (kΩ) that are coupled in series.

Since the resistances of resistor 332a and resistor 332b are smaller than the resistances of resistor 132a and resistor 132b of the first exemplary embodiment of the present invention, the amounts of the currents outputted from current controlling unit 332 are increased. Accordingly, accuracy of the measurement of the battery pack voltage can be improved, because attenuation unit 133 and noise eliminating unit 134 more sensitively respond to slight variations of the currents. In the other hand, as the amounts of the currents outputted from current controlling unit 332 are increased, the amounts of leakage currents maybe increased, which is the current generated while the power source of BMS 1 is off. However, the leakage currents may be efficiently blocked by leakage prevention relay 335, which will now be described.

Leakage prevention relay 335 is turned on in response to the control signal, TOTAL_VOL_SW, outputted from control signal generator 310, and is turned off when BMS 1 is turned off. Leakage prevention relay 335 connects signal line 131+ and signal line 131− to a negative (−) input terminal and a positive (+) input terminal of differential amplifier 133c, respectively, when leakage prevention relay 335 is turned on. But there is no electrical connection between signal line 131+ and the negative (−) input terminal, and between signal line 131− and the positive (+) input terminal of differential amplifier 133c, when leakage prevention relay 335 is turned off.

The control signal, TOTAL_VOL_SW, has an on-level voltage when BMS 1 is turned on. That is, when the power source of BMS 1 is turned on, leakage prevention relay 335 is turned on. The control signal, TOTAL_VOL_SW, is also referred to an on-level control signal. Since leakage prevention relay 335 is turned off when BMS 1 is turned off, a leakage path of currents generated by battery 2 to attenuation unit 133 (or a battery pack voltage measurement signal generating unit) is blocked. Accordingly, the leakage of currents from battery 2 can be completely prevented, and therefore charging capacity of battery 2 can be securely maintained.

According to the second exemplary embodiment of the present invention, since the leakage prevention relay is provided to the battery pack voltage measuring unit, the leakage currents generated by the battery are blocked when the power source of the BMS is turned off, and the charging capacity of the battery can be efficiently maintained. Because leakage current can be blocked by the leakage prevention relay 335, the amounts of the currents passing current control unit 332 can be increased by the use of resistors having low resistance, and therefore the accuracy for measuring the battery pack voltage can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A battery management system coupled to a battery, comprising:
    a sensing stabilization unit including a first signal line and a second signal line coupled to a first terminal and a second terminal of the battery, respectively, the sensing stabilization unit maintaining a stable potential difference between the first signal line and the second signal line, the sensing stabilization unit further including a resistor and a capacitor that are directly connected in parallel at the same node between the first signal line and the second signal line;
    a battery pack voltage measurement signal generating unit coupled to the sensing stabilization unit, and outputting a battery pack voltage measurement signal that is produced based on the potential difference between the first signal line and the second signal line; and
    an analog/digital (A/D) converter coupled to the battery pack voltage measurement signal generating unit, and receiving the battery pack voltage measurement signal and converting the battery pack voltage measurement signal into a digital signal.

2. The battery management system of claim 1, further comprising a current controlling unit coupled to the first signal line and the second signal line of the sensing stabilization unit, and coupled to the battery pack voltage measurement signal generating unit, the current controlling unit controlling amounts of currents flowing to the battery pack voltage measurement signal generating unit.

3. The battery management system of claim 2, comprised of the current controlling unit including:
    a first resistor coupled to the first signal line; and
    a second resistor coupled to the second signal line.

4. The battery management system of claim 1, further comprising a noise eliminating unit coupled to the battery pack voltage measurement signal generating unit, and eliminating a noise in the battery pack voltage measurement signal of the battery pack voltage measurement signal generating unit.

5. The battery management system of claim 1, comprised of the battery including a plurality of battery cells.

6. A battery management system coupled to a battery including a plurality of battery cells in a battery pack, comprising:
    a control signal generator for generating a control signal, the control signal generator generating an on-level control signal when the battery management system is turned on;
    a cell voltage measuring unit coupled to the battery, and measuring voltages of the plurality of the battery cells and outputting a plurality of cell voltage measurement signals;
    a battery pack voltage measuring unit coupled to the battery and coupled to the control signal generator, the battery pack voltage measuring unit receiving the control signal from the control signal generator and measuring a battery pack voltage of the battery, the battery pack voltage measuring unit outputting a battery pack voltage measurement signal, the battery pack voltage measuring unit including a sensing stabilization unit, the sensing stabilization unit including a resistor and a capacitor that are directly connected in parallel at the same node between a first signal line and a second signal line that are coupled to a first terminal and a second terminal of the battery, respectively;

a battery pack current measuring unit coupled to the battery, and measuring a battery pack current of the battery and outputting a battery pack current measurement signal; and an analog/digital converter receiving the cell voltage measurement signals, the battery pack voltage measurement signal, and the battery pack current measurement signal, the analog/digital converter converting the cell voltage measurement signals, the battery pack voltage measurement signal, and the battery pack current measurement signal to digital signals, respectively.

7. The battery management system of claim 6, comprised of the battery pack voltage measuring unit including:

a relay being turned on when the relay receives an on-level control signal from the control signal generator, the relay transmitting a potential difference between a first output terminal and a second output terminal of the battery; and a battery pack voltage measurement signal generating unit coupled to the relay, and generating a battery pack voltage measurement signal produced based on the potential difference transmitted by the relay.

8. The battery management system of claim 7, comprised of the battery pack voltage measuring unit including:

a first resistor coupled to the first output terminal of the battery and coupled to a first input terminal of the relay; and a second resistor coupled to the second output terminal of the battery and coupled to a second input terminal of the relay.

9. The battery management system of claim 7, comprised of the battery pack voltage measurement signal generating unit including an inverting differential amplifier for generating the battery pack voltage measurement signal.

10. The battery management system of claim 7, comprised of the relay not transmitting the potential difference between a first output terminal and a second output terminal of the battery when the battery management system is turned off.

* * * * *